United States Patent [19]

Yamazaki

[11] Patent Number: 4,906,491

[45] Date of Patent: Mar. 6, 1990

[54] SEMICONDUCTOR DEVICE MANUFACTURING METHODS

[75] Inventor: Shunpei Yamazaki, Tokyo, Japan

[73] Assignee: Semiconductor Energy Laboratory Co., Ltd., Tokyo, Japan

[21] Appl. No.: 186,745

[22] Filed: Apr. 25, 1988

Related U.S. Application Data

[63] Continuation of Ser. No. 922,802, Oct. 24, 1986, abandoned, which is a continuation of Ser. No. 627,604, Jul. 3, 1984, abandoned.

[30] Foreign Application Priority Data

Jul. 4, 1983 [JP] Japan .................................. 58-121426

[51] Int. Cl.$^4$ ............................................. B05D 3/06
[52] U.S. Cl. ............................... 427/531; 219/121.67; 219/121.7; 219/121.72
[58] Field of Search ................................ 427/53.1, 38; 219/121.67, 121.7, 121.72; 136/244

[56] References Cited

U.S. PATENT DOCUMENTS

| | | | |
|---|---|---|---|
| 3,453,097 | 7/1969 | Hafner | 219/121 LG |
| 3,935,419 | 1/1976 | Lambert et al. | 219/121 LG |
| 4,181,563 | 1/1980 | Miyaka et al. | 427/53.1 |
| 4,214,249 | 7/1980 | Kasai et al. | 427/53.1 |
| 4,238,803 | 12/1980 | Terao et al. | 427/53.1 |
| 4,315,096 | 2/1982 | Tyan et al. | 136/244 |
| 4,428,110 | 1/1984 | Kim | 29/572 |
| 4,472,456 | 9/1984 | Shah | 427/53.1 |
| 4,473,737 | 9/1984 | Anthony | 219/121.85 |

*Primary Examiner*—Stanley Silverman
*Attorney, Agent, or Firm*—Gerald J. Ferguson, Jr.

[57] ABSTRACT

In a photoelectric conversion device manufacturing method which includes at least a step of forming a non-single-crystal semiconductor layer, a transparent or nontransparent layer, or a laminate member composed of transparent and nontransparent layers by patterning with a laser beam, a laser beam which has a short wavelength of 600 nm or less, a spot diameter of 3 to 60 nm and a width of 50 nano-second is used for the patterning.

1 Claim, 3 Drawing Sheets

SEMICONDUCTOR DEVICE MANUFACTURING METHODS

This application is a continuation of Ser. No. 922,802, filed Oct. 24, 1986, which was itself a continuation of application Ser. No. 627,604 filed July 3, 1984, both now abandoned.

BACKGROUND OF THE INVENTION

1. Field of the Invention

The present invention relates to a method for the manufacture of a semiconductor device which has at least a non-single-crystal semiconductor layer, transparent or nontransparent conductive layer, or laminate member composed of transparent and nontransparent conductive layers, such as a semiconductor photoelectric conversion device, field effect transistor or the like, and more particularly to improvement in a semiconductor device manufacturing method which includes at least a step of forming a non-single-crystal semiconductor layer, transparent or nontransparent conductive layer, or laminate member composed of transparent and nontransparent conductive layers by patterning with a laser beam.

2. Description of the Prior Art

Heretofore there has been proposed a semiconductor device manufacturing method which includes at least a step of forming a non-single-crystal semiconductor layer, transparent or nontransparent conductive layer, or laminate member composed of transparent and nontransparent conductive layers by patterning with a laser beam.

Compared with another manufacturing method which employs a photolithography technique for the formation of such a layer, the abovesaid method excels in that the layer can be formed without any defects. The reason for this is that in the case of forming the layer by photolithography, a photoresist mask therefor is prone to pinholing or exfoliation at its marginal edges, which results in the formation of defects, whereas the method utilizing the patterning process with a laser beam has no such factors which cause defects.

With the conventional method employing the patterning technique with a laser beam for the formation of the non-single-crystal semiconductor layer, transparent or nontransparent conductive layer, or laminate member composed of transparent and non-transparent conductive layers, it is a general practice to use a YAG laser which emits a laser beam having a relatively long wavelength of about 1060 nm.

The absorption coefficient of the abovesaid layer for the laser beam of such a relatively long wavelength is extremely low. For example, the absorption coefficient of a non-single-crystal silicon layer is $10^3$/cm or so. In consequence, the laser beam enters very deeply into the non-single-crystal semiconductor layer, transparent or nontransparent conductive layer, or laminate member. For instance, the penetration depth of such a laser beam into the non-single-crystal semiconductor layer is approximately 10 $\mu$m at a depth where the light intensity is 1/e (where e is nearly equal to 2.72) of the light intensity on the surface of the layer, and around 1000 $\mu$m at a depth where the light intensity is 1/100 of the light intensity on the layer surface.

Accordingly, when the non-single-crystal semiconductor layer, the transparent or nontransparent conductive layer, or laminate member is as thin as 1 $\mu$m or less, it is feared that a substrate and other layers underlying it is damaged or patterned. Also it is feared that the marginal edges of the non-single-crystal semiconductor layer, transparent or non-transparent conductive layer, or laminate member are swollen or exfoliated.

Furthermore, in the case of the laser beam having such a relatively long wavelength of 1060 nm or so, it is difficult to reduce its minimum spot diameter to a small value of 100 $\mu$m or less. Therefore, difficult, with the conventional manufacturing method, to finely form the non-single-crystal semiconductor layer, transparent or nontransparent conductive layer, or laminate member with high precision. In addition, in the case of simultaneously forming a plurality of non-single-crystal semiconductor layers, transparent or nontransparent conductive layers, or laminate members, they cannot be spaced apart a small distance of 100 $\mu$m or less. This imposes severe limitations on the fabrication of a small and compact semiconductor device having a plurality of non-single-crystal semiconductor layers, transparent or nontransparent conductive layers, or laminate members.

SUMMARY OF THE INVENTION

It is therefore an object of the present invention to provide a novel method for manufacture of a semiconductor device, in particular, a semiconductor device having at least a non-single-crystal semiconductor layer, transparent or nontransparent conductive layer, or laminate member composed of transparent and nontransparent conductive layers, which is free from the abovesaid defects of the prior art.

The semiconductor device manufacturing method of the present invention includes at least a step of forming the non-single-crystal semiconductor layer, or transparent or nontransparent conductive layer, or laminate member by patterning with a laser beam as in the prior art manufacturing method.

However, the manufacturing method of the present invention differs from the conventional method in using, for the patterning of the layer, a laser beam having a wavelength of 600 nm or less which is far shorter than the wavelength of the beam employed in the conventional method.

With the use of the laser beam having such a short wavelength equal to or less than 600 nm, the absorption coefficient of the non-single-crystal semiconductor, transparent or nontransparent conductive layer, or laminate member for the laser beam is far higher than the absorption coefficient for the laser beam having the long wavelength of about 1060 nm. For example, the absorption coefficient of a non-single-crystal semiconductor layer is $10^5$/cm or more, which is more than 100 times larger than the absorption coefficient (approximately $10^3$/cm) for the laser beam of the 1060 nm or so wavelength used in the past. Therefore, the penetration depth of the laser beam of such a short wavelength into the abovesaid layer is far smaller than in the case of the laser beam of the above-mentioned long wavelength. For instance, the penetration depth of the laser beam of the 600 nm or less wavelength into the non-single-crystal semiconductor layer is 700 Å or less at a depth where the beam intensity is 1/e (where e is equal to 2.72) of the beam intensity on the layer surface, and 1 $\mu$m or less at a depth where the beam intensity is 1/100 of that on the layer surface. This is more than 1000 times smaller than the depth (10 $\mu$m or so) in the case of using the laser beam having the 1060 nm or so wavelength in the prior art manufacturing method.

Therefore, according to the semiconductor manufacturing method of the present invention, even if the non-single-crystal semiconductor layer, transparent or nontransparent conductive layer, or laminate member to be patterned is as thin as 1 μm or less, there is no possibility of damaging or patterning the underlying substrate or other layers by the laser beam. Further, the method of the present invention is free from the fear of swelling or exfoliating the marginal edges of the layer as a result of the patterning thereof.

Moreover, the laser beam of the 600 nm or less wavelength can be easily reduced to such a minimum spot diameter as small as 100 μm or less. This permits the formation of the non-single-crystal semiconductor layer, transparent or nontransparent conductive layer, or laminate member with higher precision and more finely than in the past. Moreover, in the case of forming a plurality of such non-single-crystal semiconductor layers, transparent or nontransparent conductive layers, or laminate members, they can be spaced apart such a small distance as 100 μm or less. Accordingly, the manufacturing method of the present invention provides a smaller and more compact semiconductor device having a plurality of non-single-crystal semiconductor layers, transparent or nontransparent conductive layers, or laminate member than does the conventional method.

Other objects, features and advantages of the present invention will become more fully apparent from the following detailed description taken in conjunction with the accompanying drawings.

DESCRIPTION OF THE PREFERRED EMBODIMENTS

Figure 1A:
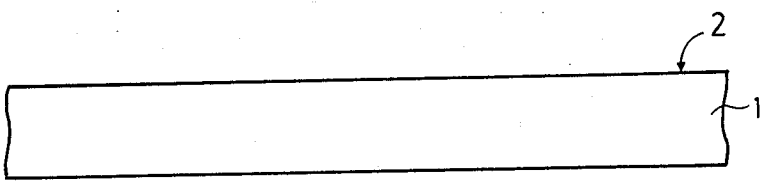
FIGS. 1A to H are schematic sectional views illustrating, by way of example, a sequence of steps involved in the manufacture of a semiconductor photoelectric conversion device having a plurality of semiconductor photoelectric conversion transducers according to the present invention.

Referring first to FIG. 1, the manufacture of the semiconductor photoelectric conversion device according to the present invention starts with the preparation of a substrate 1 (FIG. 1A).

The substrate 1 has a surface 2 of an organic or inorganic insulator. As such a substrate 1, for example, a synthetic resin substrate can be used which is transparent or nontransparent. It is also possible to employ a ceramic substrate, a transparent glass substrate and a substrate which has an insulating film as of synthetic resin, a silicon oxide or the like, deposited on a stainless steel or metal plate.

Figure 1B:
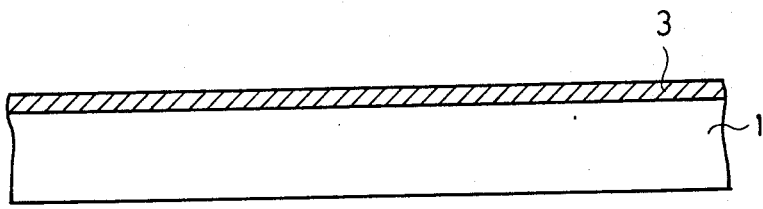

A conductive layer 3 is formed on the substrate 1, by means of a known evaporation method or CVD method (FIG. 1B).

The conductive layer 3 has a thickness of 1 μm or less.

The conductive layer 3 may be formed as a transparent conductive layer. In this case, the substrate 1 is transparent. The transparent conductive layer 3 is constituted principally of a sublimable metallic oxide such as $SnO_2$, $In_2O_3$ or ITO (Indium-Tin oxide), or a sublimable matallic nonoxide such as a Si-Cr or Si-Ni alloy.

The conductive layer 3 may also be formed as a nontransparent conductive layer. In such a case, the substrate 1 need not be transparent. The nontransparent conductive layer 3 is constituted principally of a sublimable metal such as Cr, a Cr-Cu alloy (containing 0.1 to 50 Wt % of Cu), Cr-Ag alloy (containing 0.1 to 50 wt % of Ag) or Cr-N alloy (containing 0.1 to 50 wt % of N), or a nonsublimable metal such as Al, Cu or Ag.

Further, the conductive layer 3 may also be a laminate member which comprises a transparent conductive layer constituted principally of the abovesaid sublimable metallic oxide or sublimable metallic nonoxide and a nontransparent conductive layer constituted principally of the abovesaid sublimable metal or nonsublimable metal. In this case, the nontransparent conductive layer is formed on the side of the substrate 1, and the substrate 1 need not be transparent.

Figure 1C:
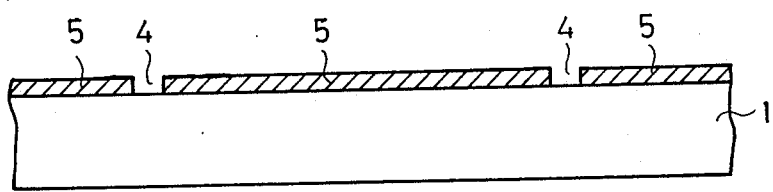

Next, the conductive layer 3 is subjected to patterning by the use of a laser beam, forming a plurality of conductive layers 5 which are each isolated from adjacent ones of them by a groove 4 of a width substantially equal to the spot diameter of the laser beam (FIG. 1C).

The laser beam used in this case is a pulse laser beam that has a short wavelength of 600 nm or less, a spot diameter of 3 to 60 μm and width of 50 nanosecond or less.

As the pulse laser beam, a pulse laser beam of a 530 nm or so wavelength can be used which is obtainable with a YAG laser. It is also possible to employ a pulse laser beam of a 193 nm or so (ArF), 248 nm or so (KrF), 308 nm or so (XeCl) or 351 nm or so (XeF) wavelength which is obtainable with an excimer laser, a laser beam of a 514.5 nm or so, 488 nm or so, 458 nm or so, 363 nm or so or 351 nm or so wavelength which is obtainable with an argon laser, or a laser beam of a 337 nm or so wavelength which is obtainable with a nitrogen laser.

Figure 2A:
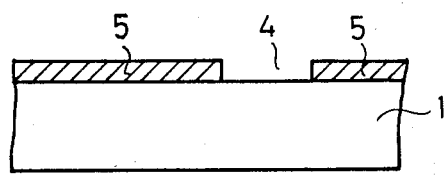
FIGS. 2A to D are schematic sectional views explanatory of a conductive layer which is formed on a substrate in the fabrication of the semiconductor photoelectric conversion device.
Figure 2B:
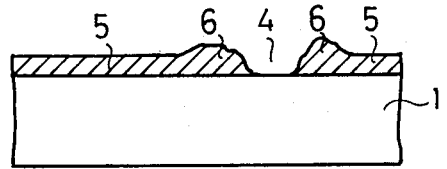
Figure 2C:
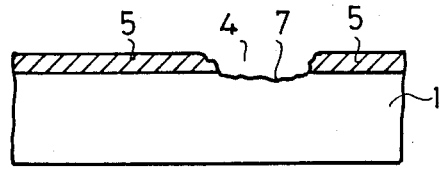
Figure 2D:
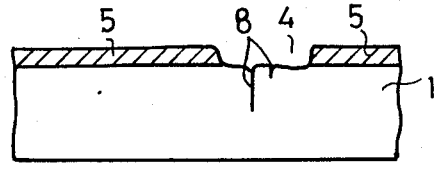

Since the laser beam has such a short wavelength of 600 nm or less, the absorption coefficient of the conductive layer 3 for the laser beam is more than 100 times larger than the absorption coefficient for a laser beam having a long wavelength of about 1060 nm which is obtainable with a YAG laser. Accordingly, the conductive layer 3 is effectively heated by the laser beam locally at the position of its irradiation. On the other hand, since the conductive layer 3 is as thin as 1 μm or less, it does not unnecessarily transfer therethrough heat resulting from the irradiation by the laser beam, namely, the heat generated in the layer 3 does not unnecessarily escape therefrom to outside through the layer 3 itself. Moreover, the substrate 1 has the insulating surface, and hence it also prevents that the heat generated in the conductive layer 3 unnecessarily escape therefrom to the outside through the substrate 1. Accordingly, the material of the conductive layer 3 is effectively sublimed at the position of irradiation by the laser beam. As a result of this, conductive layers 5 are neatly formed, along with the grooves 4, as shown in FIG. 2A. In this case, there are no possiblities that the material of the conductive layers 5, molten by the laser beam irradiation, is deposited on the marginal edges of the conductive layers 5, as indicated by 6, in FIG. 2B. Further, since the laser beam is effectively absorbed by the conductive layer 3 because of its short wavelength, it would not inflict on the substrate unnecessary damages such as depressions and cracks as indicated by 7 and 8 in FIGS. 2C and D. The effects described just above are prominent especially when the conductive layer 3 is a transparent conductive layer which is constituted principally of the aforementioned sublimable metallic oxide or sublimable metallic nonoxide, a nontransparent conductive layer which is constituted principally of the aforesaid sublimable metal, or a limanate member composed of such transparent and nontransparent conductive layers. Incidentally, even if the conductive layer 3 is a nontransparent conductive layer which is constituted principally of the aforementioned nonsublimable metal, or a laminate member comprised of the abovesaid transparent conductive layer and the nontransparent conductive layer which is constituted mainly of the aforementioned nonsublimable metal, the substrate 1 is not unnecessarily damaged because it has the surface of an insulator.

Figure 1D:
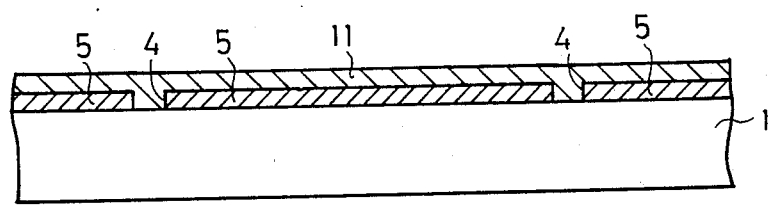

Next, a non-single-crystal semiconductor layer 11 is formed, by a known CVD, low-pressure CVD, plasma CVD or optical CVD method, on the substrate 1 so that it covers the conductive layers 5 and extend into the grooves 4 (FIG. 1D).

The non-single-crystal semiconductor layer 11 also has a thickness of 1 $\mu$m or less.

The non-single-crystal semiconductor layer 11 has such a PN junction structure that a P-type non-single-crystal semiconductor layer and N-type non-single-crystal semiconductor layer are laminated one on the other in this order or in the reverse order, or such a PIN junction structure that a P-, I- and N-type non-single-crystal semiconductor layers are laminated one on another in this order or in the reverse order.

The non-single-crystal semiconductor layer 11 is constituted mainly of a sublimable semiconductor such as Si, $Si_xGe_{1-4}$ (where $0<x<0.5$), $Si_xC_{1-x}$ (where $0<x<1$), $Si_3N_{n-x}$ (where $0<x<2$) or $SiO_{2-x}$ (where $0<x<1$), and the layer 11 has introduced therein hydrogen or a halogen as a dangling bond neutralizer.

Figure 1E:
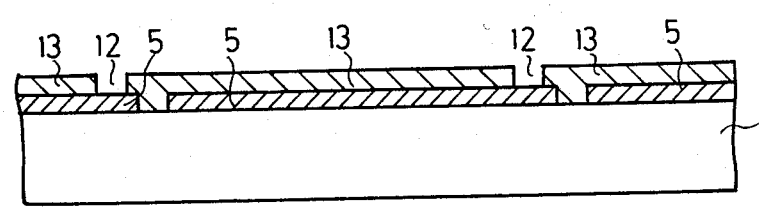

Next, The non-single-crystal semiconductor layer 11 is subjected to patterning by a laser beam, forming a plurality of non-single-crystal semiconductor layers 13 each isolated from adjacent ones of them by a groove 12 of a width nearly equal to the spot diameter of the laser beam (FIG. 1E).

In this case, the grooves 12 are each formed to expose each conductive layer 5 in the vicinity of each groove 4. Accordingly, each non-single-crystal semiconductor layer 13 extends on one conductive layer 5 and into the groove 4 and further onto the adjoining conductive layer 5 slightly.

The patterning of the non-single-crystal semiconductor layer 11 is effected through using the same laser beam as that for the formation of the conductive layers 5. Therefore, no detailed description will be repeated.

Figure 3A:
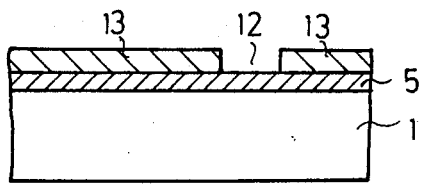
FIGS. 3A and B are schematic sectional views explanatory of a conductive layer which is formed on the non-single-crystal semiconductor layer in the fabrication of the semiconductor photoelectric conversion device.
Figure 3B:
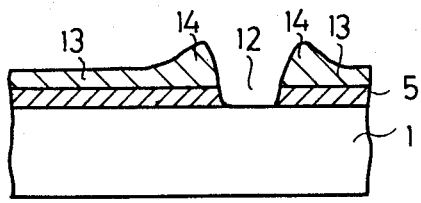

The absorption coefficient of the non-single-crystal semiconductor layer 11 for the laser beam is also large as is the case with the aforementioned conductive layer 3, because the laser beam used has such a short wavelength as 600 nm or less. Therefore, the non-single-crystal semiconductor layer 11 is effectively heated at the position of irradiation by the laser beam as in the case of the aforementioned conductive layer 3. Further, since the non-single-crystal semiconductor layer 11 is as thin as 1 $\mu$m or less, it does not transfer laterally therethrough the heat generated therein preventing that the heat unnecessarily escapes from the layer 11 to the outside, as described previously. Moreover, the non-single-crystal semiconductor layer 11 is constituted principally of the sublimable semiconductor, as referred to previously. This enables the non-single-crystal semiconductor layers 13 to be formed neatly, along with the grooves 12, as shown in FIG. 3A, and ensures to prevent that the material of each non-single-crystal semiconductor layer 13, molten by the laser beam irradiation, is deposited on its marginal edge, as indicated by 14 in FIG. 3B, and that the conductive layer 5 is hollowed, by the laser beam, to form therein a deep depression which may sometimes reach the substrate 1, as indicated by 15 in FIG. 3B.

Figure 1F:
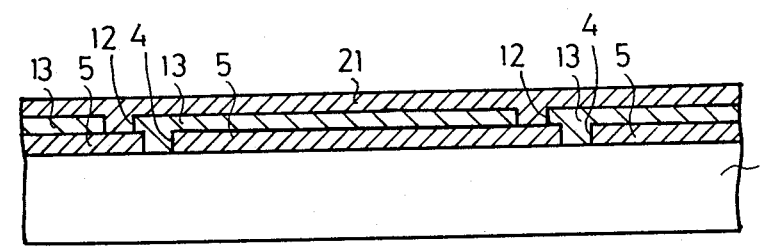

Next, a conductive layer 21, which covers the non-single-crystal semiconductor layers 13 and extends into the grooves 12, is formed on the substrate 1 by the same method as that for the formation of the conductive layer 3 (FIG. 1F).

The conductive layer 21 also has a thickness of 1 $\mu$m or less.

The conductive layer 21 may be formed as a transparent conductive layer which is constituted principally of the sublimable matallic oxide or sublimable metallic nonoxide mentioned previously with regard to the conductive layer 3. In this case, the substrate 1 need not be transparent.

The conductive layer 21 may also be formed as a nontransparent conductive layer which is constituted principally of the aforesaid sublimable metal. In such a case, the substrate 1 is transparent.

Moreover, the conductive layer 21 may also be formed as a laminate member which composed of a transparent conductive layer constituted mainly of the aforesaid sublimable metallic oxide or sublimable metallic nonoxide and a nontransparent conductive layer which is constituted mainly of the aforementioned sublimable or nonsublimable metal. In this case, the transparent conductive layer is formed on the side of the non-single-crystal semiconductor layer 13, and the substrate 1 is transparent.

Figure 1G:
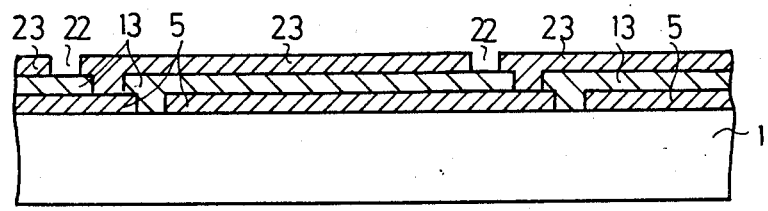
Figure 1H:
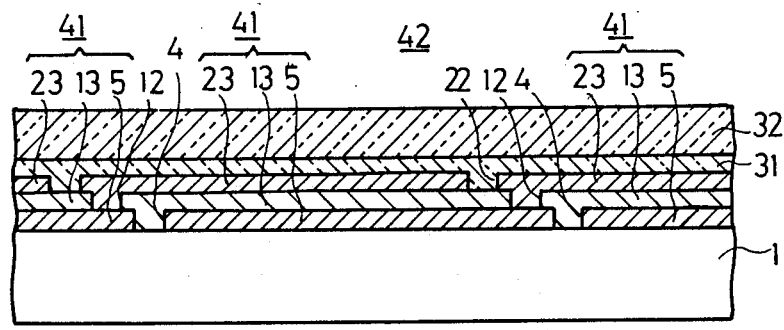

Next, the conductive layer 21 is subjected to patterning with a laser beam, forming a plurality of conductive layers 23 which are each isolated from adjacent ones of them by a groove 22 of a width nearly equal to the spot diameter of the laser beam (FIG. 1G).

In this case, the grooves 22 are each formed to expose one of the non-single-crystal semiconductor layers 13 in the vicinity of one of the grooves 12. Accordingly, each conductive layer 23 extends on one of the non-single-crystal semiconductor layers 13 and down into one of the grooves 12, wherein it is connected to the underlying conductive layer 5, and it further extends slightly onto the adjoining non-single-crystal semiconductor layer 13.

The laser beam used for the patterning of the conductive layer 21 into the conductive layers 23 is the same as that for the formation of the conductive layers 5 and the non-single-crystal semiconductor layer 13. Therefore, no detailed description will be repeated.

Figure 4A:
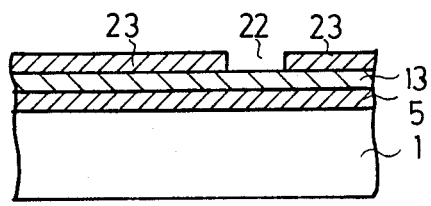
FIGS. 4A to C are schematic sectional views explanatory of a conductive layer which is formed on the non-single-crystal semiconductor layer in the fabrication of the semiconductor photoelectric conversion device.
Figure 4B:
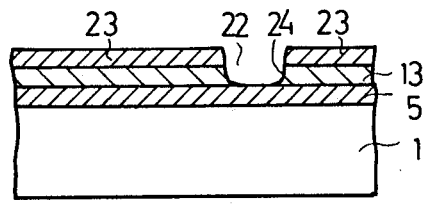
Figure 4C:
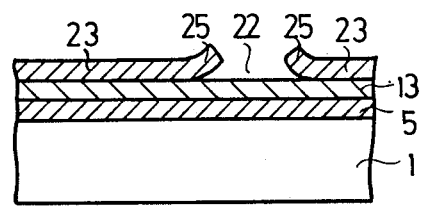

The absorption coefficient of the conductive layer 21 for such a laser beam is large as described previously in connection with the formation of the conductive layers 5 and the non-single-crystal semiconductor layers 13. On the other hand, the conductive layer 21 is thin and its portion on the side of the non-single-crystal semiconductor layer 13 is constituted mainly of the sublimable metallic oxide, sublimable metallic nonoxide or sublimable metal, so that the conductive layers 23 are neatly formed, along with the grooves 22. That is to say, there is no possibilities that the underlying non-single-crystal semiconductor layers 13 are hollowed, by the laser beam, to form therein deep depression which may sometime reach the underlying conductive layers 5, as indicated by 24 in FIG. 4B, and that the conductive layers 23 are exfoliated at their marginal edges, as indicated by 25 in FIG. 4C.

Next, a passivation film 31 as of silicon nitride, which covers the conductive layers 23 and extends into the grooves 22, is formed by, for instance, a known plasma CVD method, and a protective film 32 of a synthetic resin is formed on the passivation film 31.

In such a manner as described above, a semiconductor photoelectric conversion device 42 is fabricated in which a plurality of semiconductor photoelectric transducers 41, each comprising the conductive layer 5, the non-single-crystal semiconductor layer 13 and the conductive layer 23, are connected in series through the portions of the conductive layers 23 extending into the grooves 12.

With the manufacturing method of the present invention described above, the conductive layer 5, the non-single-crystal semiconductor layer 13 and the conductive layer 23, which make up each semiconductor photoelectric transducer 41, can be easily formed with high accuracy and finely, without damaging them or exfoliating their marginal edges and without cracking the substrate 1.

Further, the respective layers of each semiconductor photoelectric transducer 41 are isolated from the layers of the adjoining transducer 14 by a groove of a width substantially equal to the diameter of the laser beam, which is as small as 3 to 60 μm, so that a semiconductor photoelectric conversion device 42 can easily be manufactured in which a plurality of semiconductor photoelectric transducers 41 are arranged with a high density.

While in the foregoing present invention has been described as being applied to the manufacture of a semiconductor photoelectric conversion device, it will be apparent that the invention is applicable to the manufacture of various semiconductor devices, including a semiconductor device of the type having a non-single-crystal semiconductor layer formed directly on the substrate, without departing from the spirits of the present invention.

What is claimed is:

1. A method for patterning a transparent conductive layer disposed on a transparent insulating substrate comprising the step of irradiating said layer with a laser beam, said method characterized in that said transparent conductive layer is made of a sublimable conductive material selected from the group consisting of indium oxide, tin oxide and indium-tin oxide, that the thickness of said transparent conductive layer is one micron or less, and that said laser beam is emitted from an eximer laser, whereby said transparent conductive layer is formed into a plurality of electrically independent segments without damage to the transparent insulating substrate.

* * * * *